(12) United States Patent
Chao et al.

(10) Patent No.: US 8,501,510 B2
(45) Date of Patent: Aug. 6, 2013

(54) OPTOELECTRONIC COMPONENT WITH THREE-DIMENSION QUANTUM WELL STRUCTURE AND METHOD FOR PRODUCING THE SAME

(75) Inventors: Benson Chao, Hsinchu (TW); Chung-Hua Fu, Miaoli County (TW); Shih-Chieh Jang, Taoyuan County (TW)

(73) Assignee: Hermes-Epitek Corp., Taipei (TW)

( * ) Notice: Subject to any disclaimer, the term of this patent is extended or adjusted under 35 U.S.C. 154(b) by 0 days.

(21) Appl. No.: 13/473,924

(22) Filed: May 17, 2012

(65) Prior Publication Data

US 2012/0231569 A1    Sep. 13, 2012

Related U.S. Application Data

(62) Division of application No. 12/697,603, filed on Feb. 1, 2010, now Pat. No. 8,294,163.

(51) Int. Cl.
*H01L 21/00* (2006.01)
(52) U.S. Cl.
USPC ............ 438/29; 438/39; 438/40; 438/41; 438/42; 257/E33.001; 257/E33.006; 257/E33.068

(58) Field of Classification Search
USPC ............ 438/22, 29, 31, 39, 40, 41, 42, 43, 438/478, E33.001, E33.006, E33.068; 257/E33.001, E33.006, E33.068
See application file for complete search history.

(56) References Cited

U.S. PATENT DOCUMENTS

| 7,952,109 | B2 | 5/2011 | Ng | |
|---|---|---|---|---|
| 8,134,169 | B2* | 3/2012 | Yu et al. | 257/94 |
| 2003/0205717 | A1* | 11/2003 | Khare et al. | 257/103 |
| 2005/0045894 | A1* | 3/2005 | Okuyama et al. | 257/95 |

* cited by examiner

*Primary Examiner* — Eduardo A Rodela
(74) *Attorney, Agent, or Firm* — Rosenberg, Klein & Lee

(57) ABSTRACT

An optoelectronic component with three-dimension quantum well structure and a method for producing the same are provided, wherein the optoelectronic component comprises a substrate, a first semiconductor layer, a transition layer, and a quantum well structure. The first semiconductor layer is disposed on the substrate. The transition layer is grown on the first semiconductor layer, contains a first nitride compound semiconductor material, and has at least a texture, wherein the texture has at least a first protrusion with at least an inclined facet, at least a first trench with at least an inclined facet and at least a shoulder facet connected between the inclined facets. The quantum well structure is grown on the texture and shaped by the protrusion, the trench and the shoulder facet.

7 Claims, 10 Drawing Sheets

OPTOELECTRONIC COMPONENT WITH THREE-DIMENSION QUANTUM WELL STRUCTURE AND METHOD FOR PRODUCING THE SAME

CROSS-REFERENCE TO RELATED APPLICATION

This is a divisional of U.S. patent application Ser. No. 12/697,603, filed Feb. 1, 2010, currently pending, the contents of each of which is incorporated herein by reference in its entirety.

FIELD OF THE INVENTION

The present invention generally relates to an optoelectronic component, and more particularly to an optoelectronic component with three-dimension quantum well (QW) structure.

DESCRIPTION OF THE RELATED ART

A radiation emission in the short-wave visible and in the ultraviolet spectral region can be realized with nitride compound semiconductor materials because of large electronic band gap thereof. Thus, quantum well structures made of nitride compound semiconductors are often used in optoelectronic semiconductor components, such as a light emitting diode (LED). In conventional optoelectronic semiconductor components, the quantum well structures are usually grown on a planar nitride compound semiconductor layer with a preferred growth direction during the epitaxial production in the c direction ([0001] direction).

The quantum well structure is constituted by a stack of layers deposited one another and respectively having different material compositions, which leads to large piezoelectric fields because the nitride compound semiconductors have comparatively large lattice constant differences. Since the piezoelectric fields lead to a shift in the band edges of the conduction or valence band and lead to a spatial separation of electrons and holes produced by optical excitation, the recombination probability of electrons and holes and thus the probability of stimulated emission of light may be reduced.

One improved optoelectronic semiconductor component able to achieve lower piezoelectric fields is disclosed in US publication number 2006/0060833 A1. However, as the temperature of the optoelectronic semiconductor component increased, the luminous efficiency and the lifetime thereof may be decreased. Hence, it is important to produce an optoelectronic semiconductor component with lower piezoelectric fields and higher heat dissipation efficiency.

SUMMARY OF THE INVENTION

The present invention is directed to an optoelectronic component with three-dimension quantum well (QW) structure and a method for producing the same for achieving lower piezoelectric fields and higher luminous efficiency.

The present invention provides an optoelectronic component with three-dimension quantum well structure comprising a substrate, a first semiconductor layer, a transition layer, a quantum well structure and a second semiconductor layer. The first semiconductor layer is disposed on the substrate. The transition layer is grown on the first semiconductor layer, contains a first nitride compound semiconductor material and has at least a texture, wherein the texture has at least a first protrusion with at least an inclined facet, at least a first trench with at least an inclined facet and at least a shoulder facet connected between the inclined facets. The quantum well structure is grown on the texture and shaped by the protrusion, the trench and the shoulder facet.

According to an embodiment of the present invention, the optoelectronic component further comprises a second semiconductor layer disposed on the quantum well structure and contains a second nitride compound semiconductor material with opposite conduction type to the first nitride compound semiconductor material.

According to an embodiment of the present invention, the transition layer comprises at least two semiconductor material layers stacked one another. Within one texture, an uppermost semiconductor material layer has at least a first protrusion with a pyramid contour or a truncated pyramid contour and a lowermost semiconductor material layer has at least a first trench with an inverse pyramid contour or an inverse truncated pyramid contour.

According to an embodiment of the present invention, a middle semiconductor material layer has a second protrusion with a truncated pyramid contour wider than and stacked under the first protrusion, or a second trench with an inverse truncated pyramid contour wider than and formed over the first contour.

According to an embodiment of the present invention, a quantity of the texture is plural. The textures may be aligned as a grid array or arranged as a pattern. In addition, a quantity of the shoulder facet of at least one texture may be different from others. Alternatively, quantities of the shoulder facet of the textures may be all the same.

According to an embodiment of the present invention, the first protrusion is formed by a deposition process and the first trench is formed by an etching process.

According to an embodiment of the present invention, the quantum well structure comprises a plurality of barrier layers and a plurality of quantum films arranged between the barrier layers.

The present invention further provides a method for producing an optoelectronic component with three-dimension quantum well structure comprising the following steps. Step A is growing a transition layer on a first semiconductor layer disposed on a substrate, wherein the transition layer contains a first nitride compound semiconductor material and has at least a texture, and the texture has at least a protrusion with at least an inclined facet, at least a trench with at least an inclined facet and at least a shoulder facet connected between the inclined facets. In addition, step B is growing a quantum well structure on at least one inclined facet. Furthermore, step C is growing a second semiconductor layer on the quantum well structure, wherein the second semiconductor layer contains a second nitride compound semiconductor material with opposite conduction type to the first nitride compound semiconductor material.

According to an embodiment of the present invention, the step A comprises the following steps. Step A1 is applying a first mask layer to the first semiconductor layer, wherein the first mask layer has at least a first opening exposing a part of the first semiconductor layer. Step A2 is growing a semiconductor material layer on the part of the first semiconductor layer, wherein the semiconductor material layer has the trench with one inclined facet. Step A3 is removing the first mask layer to expose remaining the semiconductor layer. Step A4 is applying a second mask layer to previous semiconductor material layer, wherein the second mask layer has at least a second opening exposing a part of previous semiconductor material layer. Step A5 is growing another semiconductor material layer having the protrusion with another inclined facet on the part of previous semiconductor material layer.

Step A6 is removing the second mask layer to expose previous semiconductor material layer, so as to form the shoulder facet. In addition, the steps A4 to A6 may be repeated in sequence more than one time to form more than two semiconductor material layers respectively having the protrusion or the trench stacked to one another.

According to an embodiment of the present invention, the step A comprises the following steps. Step A1 is growing a semiconductor material layer on the first semiconductor layer. Step A2 is applying a first mask layer to the semiconductor material layer, wherein the first mask layer has at least a first opening exposing a part of the semiconductor material layer. Step A3 is etching the part of the semiconductor material layer to form the trench with one inclined facet. Step A4 is removing the first mask layer to expose remaining said semiconductor material layer. Step A5 is applying a second mask layer to previous semiconductor material layer, wherein the second mask layer has at least a second opening exposing a part of previous semiconductor material layer. Step A6 is growing another semiconductor material layer having the protrusion with another inclined facet on the part of previous semiconductor material layer. Step A7 is removing the second mask layer to expose previous semiconductor material layer, so as to form the shoulder facet. In addition, the steps A5 to A7 may be repeated in sequence more than one time to form more than two semiconductor material layers respectively having the protrusion or the trench stacked to one another.

According to an embodiment of the present invention, a slope of each inclined facet is adjusted by a growth speed of corresponding semiconductor material layer.

According to an embodiment of the present invention, the inclined facets are parallel to one another.

The present invention further provides another method for producing an optoelectronic component with three-dimension quantum well structure comprising the following steps. Step A is growing a transition layer on a buffer layer disposed on a substrate. Step B is applying a first mask layer to the transition layer, wherein the first mask layer has at least a first opening exposing a part of the transition layer. Step C is etching the transition layer from the first opening to form a trench. Step D is removing the first mask layer. Step E is applying a second mask layer to the transition layer, wherein the second mask layer has at least a second opening exposing a different part of the transition layer adjacent to the trench. Step F is growing a protrusion over the second opening. Step G is removing the second mask layer to expose the trench and the protrusion. Step H is forming at least a pair of quantum well structures on the trench and the protrusion.

According to an embodiment of the present invention, the protrusion is away from the trench at a distance. Herein, a shoulder facet is connected between an inclined facet of the protrusion and an inclined facet of the trench when the first mask layer and the second layer are removed. In addition, a slope of the inclined facet of the protrusion may be adjusted by a growth speed of the protrusion. Furthermore, the inclined facets may be parallel to one another.

According to an embodiment of the present invention, the method further comprises growing a semiconductor layer on the pair of quantum well structures, wherein the transition layer contains a first nitride compound semiconductor material and the second semiconductor layer contains a second nitride compound semiconductor material with opposite conduction type to the first nitride compound semiconductor material.

According to an embodiment of the present invention, the method further comprises processing the following steps in sequence at least one time between the steps G and H. A first step is applying a third mask layer to the transition layer and the protrusion, wherein the third mask layer has at least a third opening exposing a part of the protrusion. A second step is growing another protrusion over the third opening. In addition, a third step is removing the third mask layer to expose the trench and the protrusions.

In contrast to the conventional epitaxy of quantum well structures on a c crystal face of a substrate, the three-dimension quantum well structure of the present invention grown on the inclined facet of the protrusion or the trench may have lower piezoelectric fields generated by strain because of anisotropic relationship between strain and piezoelectric effect. In addition, since a total outer surface area is larger ($\geqq 2$ times), heat dissipation efficiency and recombination probabilities of electrons and holes are higher. Thus, the optoelectronic component with three-dimension quantum well structure may have higher luminous efficiency with semi-polar (a-plane), non-polar (m-plane) surfaces, larger current/power handling with $\geqq 2$ times quantum-well area and longer lifetime.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 1:
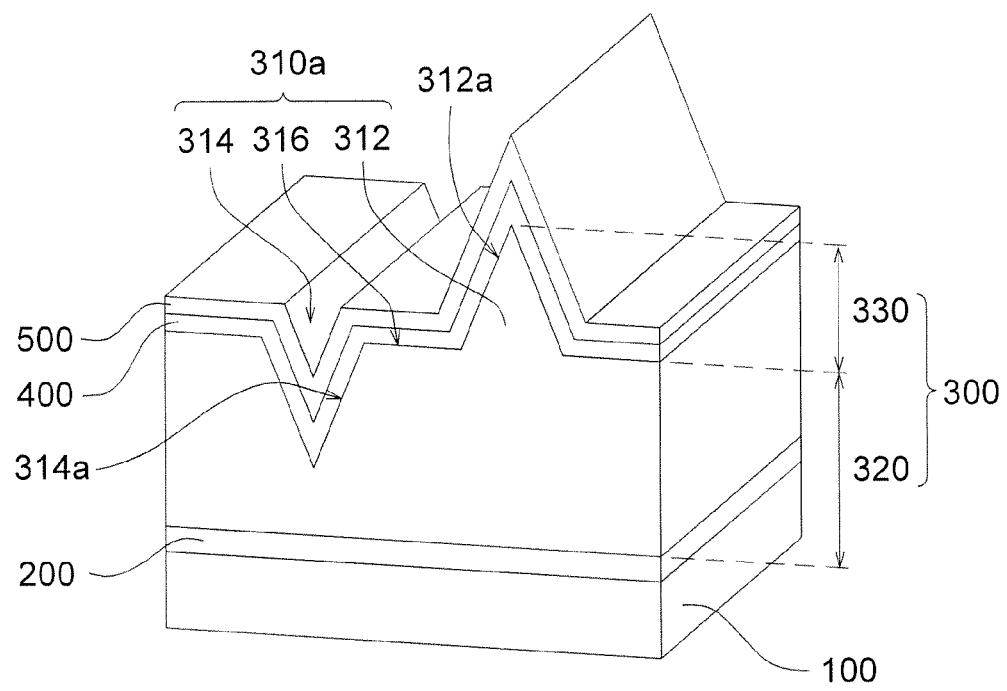
FIG. 1 illustrates a perspective view of an optoelectronic component according to an embodiment of the present invention.
Figure 2:
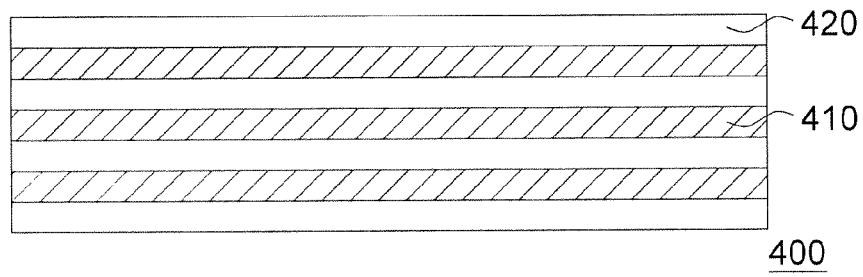
FIG. 2 illustrates a schematic view of the quantum well structure as illustrated in FIG. 1.
Figure 3:
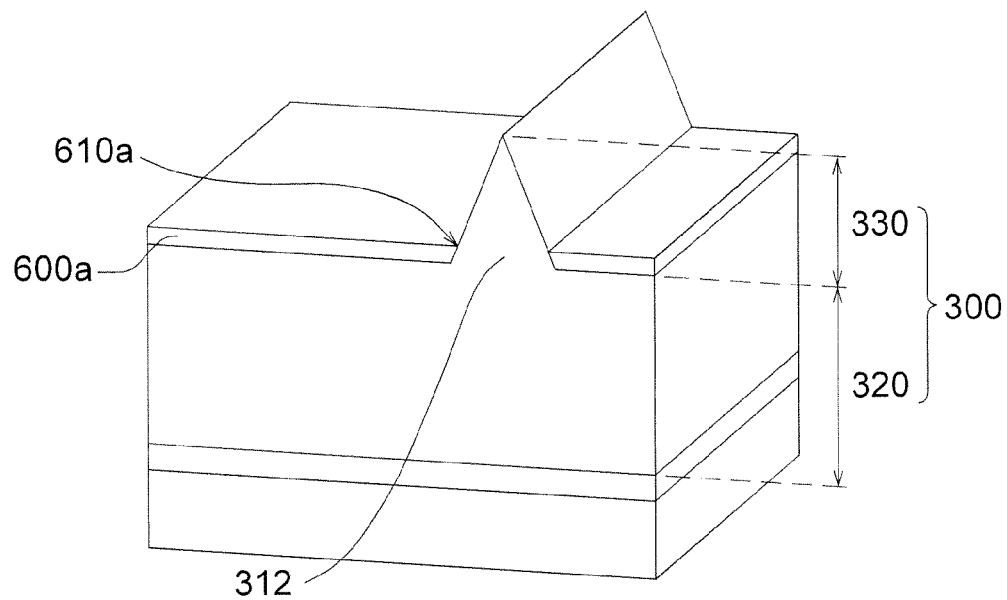
FIG. 3 illustrates a perspective view of a mask layer grown on a semiconductor material layer as illustrated in FIG. 1 before the protrusion is grown thereon.
Figure 4:
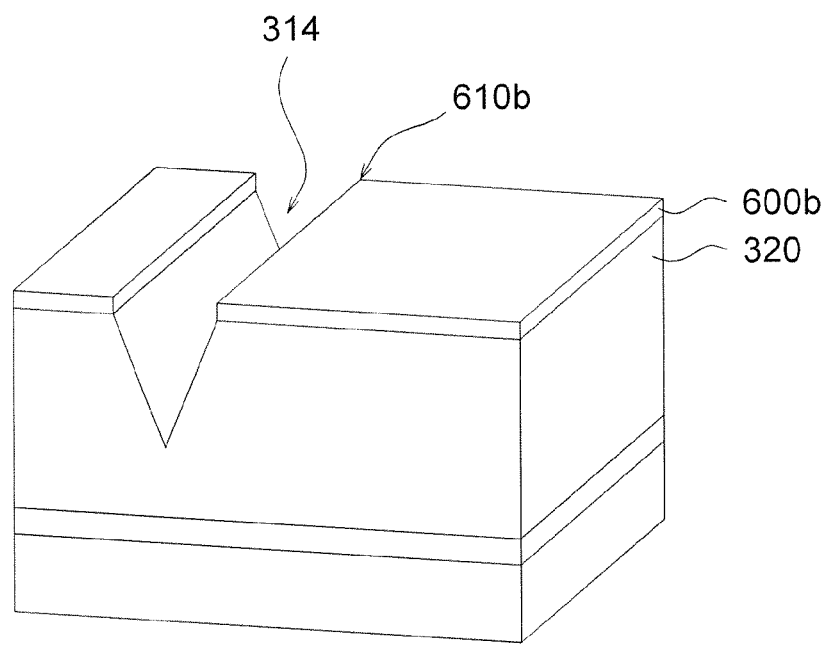
FIG. 4 illustrates a perspective view of a mask layer grown on a semiconductor material layer as illustrated in FIG. 1 before the trench is formed thereon.

FIG. 1 illustrates a perspective view of an optoelectronic component according to an embodiment of the present invention. FIG. 2 illustrates a schematic view of the quantum well structure as illustrated in FIG. 1. FIG. 3 illustrates a perspective view of a mask layer grown on a semiconductor material layer as illustrated in FIG. 1 before the protrusion is grown thereon. In addition, FIG. 4 illustrates a perspective view of a mask layer grown on a semiconductor material layer as illustrated in FIG. 1 before the trench is formed thereon. Referring to FIG. 1 first, the optoelectronic component 10a, for example an LED, comprises a substrate 100, a first semiconductor layer 200, a transition layer 300, a quantum well structure 400 and a second semiconductor layer 500. As illustrated in FIG. 1, the quantum well structure 400 is a three-dimension quantum well structure.

The substrate 100 may be a sapphire substrate. In addition, the first semiconductor layer 200 is disposed on the substrate 100 and the transition layer 300 is grown on the first semiconductor layer 200, wherein the first semiconductor layer 200 may be a GaN layer for being a buffer layer between the substrate 100 and the transition layer 300. The transition layer 300 contains a first nitride compound semiconductor material, for example n-doped GaN, and has a texture 310a, wherein the texture 310a has a protrusion 312 with an inclined facet 312a, a trench 314 with an inclined facet 314a and a shoulder facet 316 connected between the inclined facets 312a, 314a. The quantum well structure 400 is grown on the texture 310a to cover at least one of the inclined facets 312a, 314a (FIG. 1 illustrating that the quantum well structure 400 covering all of the inclined facets 312a, 314a and the shoulder facet 316), so as to form a three-dimension quantum well structure shaped by the protrusion 312, the trench 314 and the shoulder facet 316. In the present embodiment, the quantum well structure 400 may be a multiple quantum well (MQW) structure as illustrated in FIG. 2, which comprises a plurality of barrier layers 410, for example made of GaN, and a plurality of quantum films 420, for example made of InGaN, arranged between the barrier layers 410.

Furthermore, the second semiconductor layer 500 is disposed on the quantum well structure 400 and contains a second nitride compound semiconductor material with opposite conduction type to the first nitride compound semiconductor material, for example p-doped GaN. In a preferred embodiment, the first nitride compound semiconductor material may be Si-doped GaN and the second nitride compound semiconductor material may be Mg-doped GaN. Note that the quantum well structure 400 of the present invention grown on the inclined facets 312a, 314a with crystal faces different to a c crystal face (or {0001} crystal face) may have anisotropic relationship between strain and piezoelectric effect. Thus, piezoelectric fields generated by strains are reduced and the disadvantageous effects of piezoelectric fields on the optical properties of the optoelectronic component 10a are reduced. Hence, in contrast to the conventional epitaxy of quantum well structures on a c crystal face of a substrate, the quantum well structure 400 of the present invention may advantageously reduce piezoelectric fields, so that the optoelectronic component 10a may have higher luminous efficiency.

Furthermore, a total outer surface area of the three-dimension quantum well structure 400 of the present invention may be larger, for example about three times or more, than the conventional planar quantum well structure. Therefore, heat dissipation efficiency of the optoelectronic component 10a and recombination probabilities of electrons and holes in the quantum well structure 400 may be higher, so that the optoelectronic component 10a of the present invention may have higher luminous efficiency and longer lifetime.

In the present embodiment, the transition layer 300 comprises two semiconductor material layers 320, 330. The semiconductor material layer 320 may be grown on the first semiconductor layer 200 first. Then a mask layer 600a, for example made of silicon oxide or silicon nitride, with an opening 610a exposing a part of the semiconductor material layer 320 as illustrated in FIG. 3 may be grown on the semiconductor material layer 320. Thus, the semiconductor material layer 330 may be limited to be grown on the exposed part of the semiconductor material layer 320 later to form the protrusion 312 having a pyramid cross-sectional contour, and then the mask layer 600a may be removed. Alternatively, a mask layer 600b with an opening 610b exposing a part of the semiconductor material layer 320 as illustrated in FIG. 4 may be grown on the semiconductor material layer 320. Thus, the semiconductor material layer 320 may be anisotropic etched later to form the trench 314 having an inversed pyramid cross-sectional contour, and then the mask layer 600b may be removed.

Herein, the sequence of the steps for forming the protrusion 312 and the trench 314 may be determined according to users' requirement. In addition, after the steps for forming the protrusion 312 and the trench 314 are finished, the shoulder facet 316 is formed on the top surface of the semiconductor material layer 320 between the protrusion 312 and the trench 314. Accordingly, the transition layer 300 having the texture 310a as illustrated in FIG. 1 is formed, and the three-dimension quantum well structure 400 may be formed thereon later. Furthermore, in a non-illustrated embodiment, the protrusion may have a truncated pyramid cross-sectional contour and/or the trench may have an inversed truncated pyramid cross-sectional contour.

Figure 5:
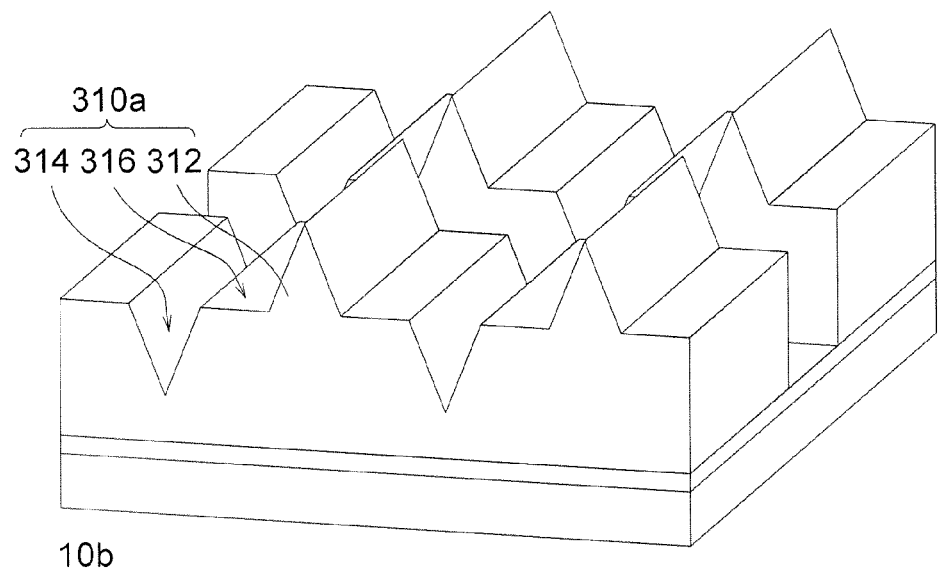
FIG. 5 illustrates a perspective view of an optoelectronic component according to another embodiment of the present invention.
Figure 6:
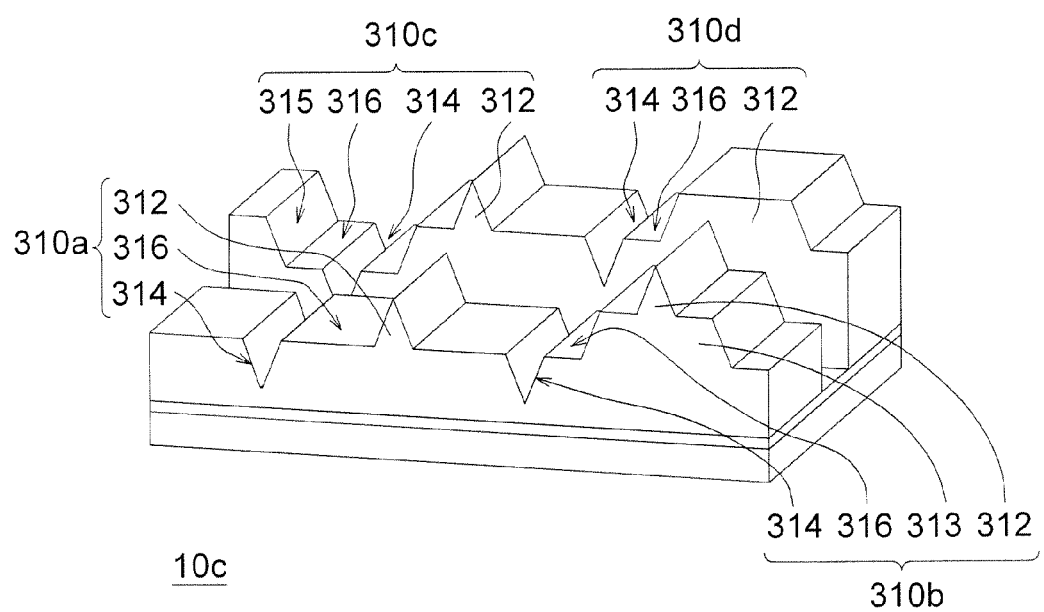
FIG. 6 illustrates a front view of an optoelectronic component according to another embodiment of the present invention.

FIGS. 5 and 6 illustrate perspective views of optoelectronic component according to other embodiments of the present invention. For clearly illustrating the textures 310a, 310b, 310c, 310d, the quantum well structure and the second semiconductor layer disposed on the transition layer 300 as illustrated in FIG. 1 are omitted in FIGS. 5 and 6. Referring to FIG. 5 first, the optoelectronic component 10b illustrated in FIG. 5 is similar to the optoelectronic component 10a illustrated in FIG. 1, besides that the optoelectronic component 10a has only one texture 310a, but the optoelectronic component 10b has four textures 310a arranged in a 2×2 array. Differently, referring to FIG. 6, besides having one texture 310a similar to that the optoelectronic component 10a had, the optoelectronic component 10c illustrated in FIG. 6 further has three textures 310b, 310c, 310d different to the texture 310a.

In detail, the transition layer 300 comprises three semiconductor material layers, and the texture 310b has two protrusions 312, 313, one trench 314 and several shoulder facets 316. The protrusion 312 having a pyramid contour is formed from the top semiconductor material layer. The protrusion 313 having a truncated pyramid contour wider than the protrusion 312 is formed from the middle semiconductor material layer and stacked under the protrusion 312. The trench 314 having an inverse pyramid contour is formed from the bottom semiconductor material layer. Thus, the shoulder facets 316 are respectively connected between side facets of the protrusion 312 and the protrusion 313, and between side facets of the protrusion 313 and the trench 314.

Further, the texture 310c has one protrusion 312, two trenches 314, 315 and several shoulder facets 316. Similar to the texture 310b, the protrusion 312 is formed from the top semiconductor material layer, and the trench 314 is formed from the bottom semiconductor material layer. Instead of the protrusion 313 of the texture 310b, the trench 315 having an inverse truncated pyramid contour wider than the trench 314 is formed from the middle semiconductor material layer and formed over the trench 314. Herein, the shoulder facets 316 are respectively connected between side facets of the protrusion 312 and the trench 315, and between side facets of the trench 314 and the trench 315. In addition, the texture 310d has one protrusion 312, one trench 314 and one shoulder facet 316, wherein the protrusion 312 having a truncated pyramid contour is formed from the top semiconductor material layer, the trench 314 having an inverse pyramid contour is formed from the middle semiconductor material layer, and the shoulder facet 316 is connected between side facets of the protrusion 312 and the trench 314.

In a word, when a quantity of the texture is plural, all textures may not only have the same contour as illustrated in FIG. 5, but also have different contour as illustrated in FIG. 6. In addition, quantities of the shoulder facets in different textures may be not only all the same as illustrated in FIG. 5, but also partially different as illustrated in FIG. 6. Furthermore, in a non-illustrated embodiment, part of the textures may have a contour different from the others and the transition layer may comprise more semiconductor material layers. Thus, quantities of the shoulder facets in different textures may be all different. Moreover, each texture may further comprise a laser resonator longitudinally of perpendicularly connected thereon, so as to form a laser diode.

Figure 7A:
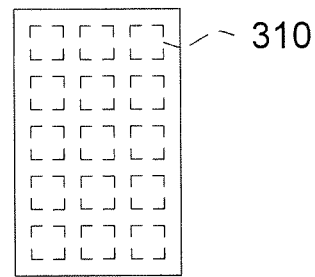
FIGS. 7A to 7C respectively illustrates a top view of an optoelectronic component according to an embodiment of the present invention.
Figure 7B:
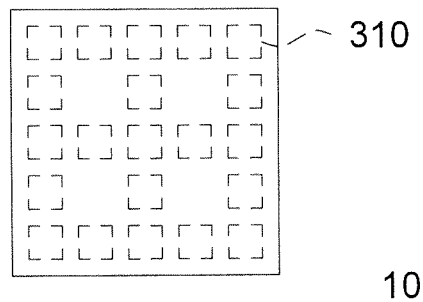
Figure 7C:
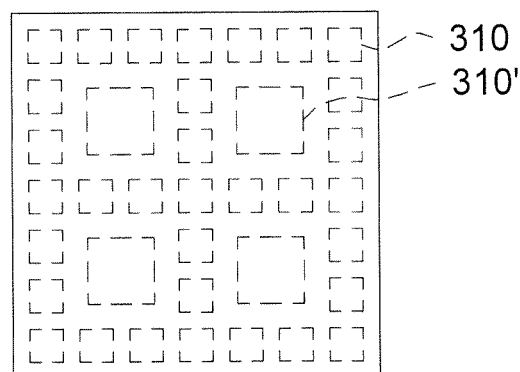

FIGS. 7A to 7C respectively illustrates a top view of an optoelectronic component according to an embodiment of the present invention, wherein a detail contour of each texture in these embodiments may be any type as illustrated in the previous embodiments and are omitted herein. In detail, besides arrangements as illustrated in the previous embodiments, the textures 310 may further be aligned as a 3×5 grid array in the optoelectronic component 10d as illustrated in FIG. 7A, or arranged as a pattern in the optoelectronic component 10e as illustrated in FIG. 7B when a quantity thereof is plural. Similarly, the textures 310 herein may not only all have the same contours, but also all or partially have different contours. In another embodiment, the optoelectronic component 10f may further have two (or more) types of the textures 310, 310' with different sizes or different detail contours arranged as a pattern as illustrated in FIG. 7C.

Besides the previous embodiments, the following description further discloses methods for producing an optoelectronic component by a plurality of embodiments according to the present invention.

Figure 8:
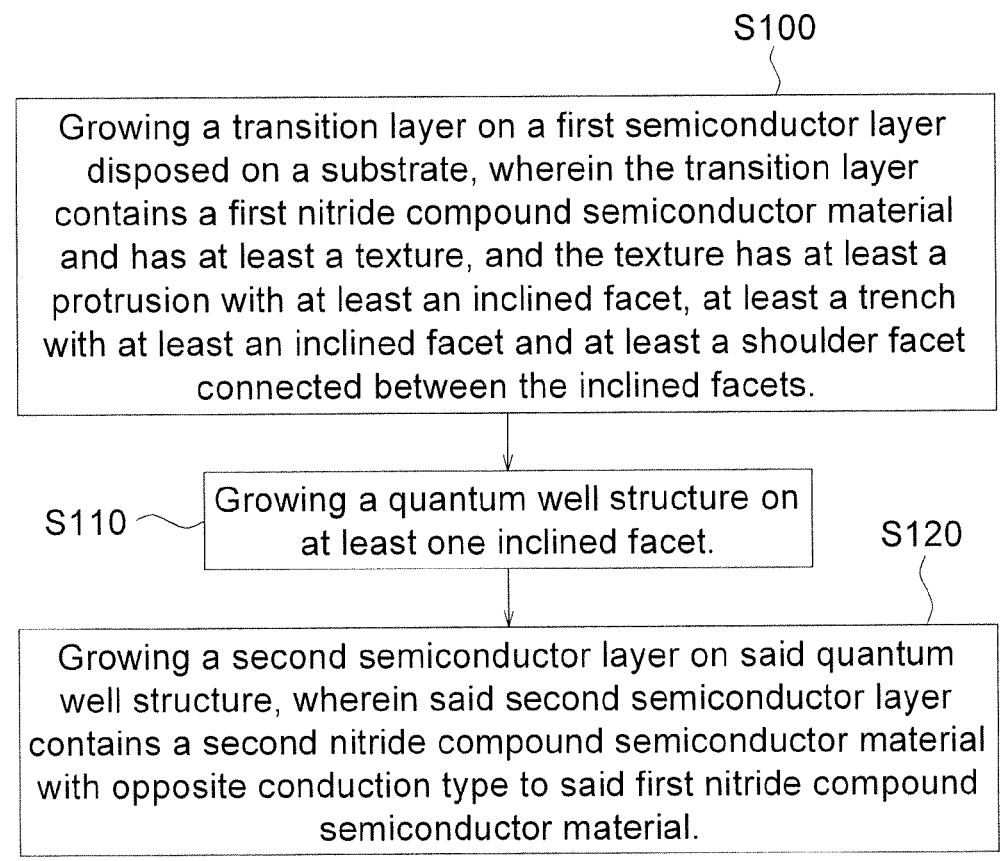
FIG. 8 illustrates a block diagram of a method for producing an optoelectronic component according to an embodiment of the present invention.

FIG. 8 illustrates a block diagram of a method for producing an optoelectronic component according to an embodiment of the present invention. Referring to FIGS. 1 and 8, a person having ordinary skill in the art may produce the optoelectronic component 10a as illustrated in FIG. 1 by the methods as illustrated in FIG. 8. First, a transition layer 300 is grown on a first semiconductor layer 200 disposed on a substrate 100, wherein the transition layer 300 contains a first nitride compound semiconductor material and has a texture 310a, and the texture 310a has a protrusion 312 with an inclined facet 312a, a trench 314 with an inclined facet 314a and a shoulder facet 136 connected between the inclined facets 312a, 314a (S100). Note that there are a lot of methods to be used for forming the protrusion 312 and the trench 314 on the transition layer 300, and some embodiments of them are disclosed hereafter.

Figure 9A:
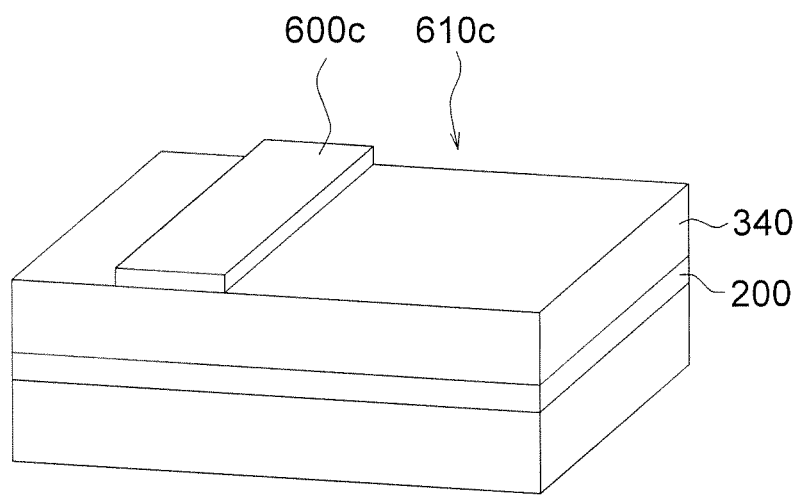
FIGS. 9A to 9C illustrate a method for growing the texture on the transition layer according to an embodiment of the present invention.
Figure 9B:
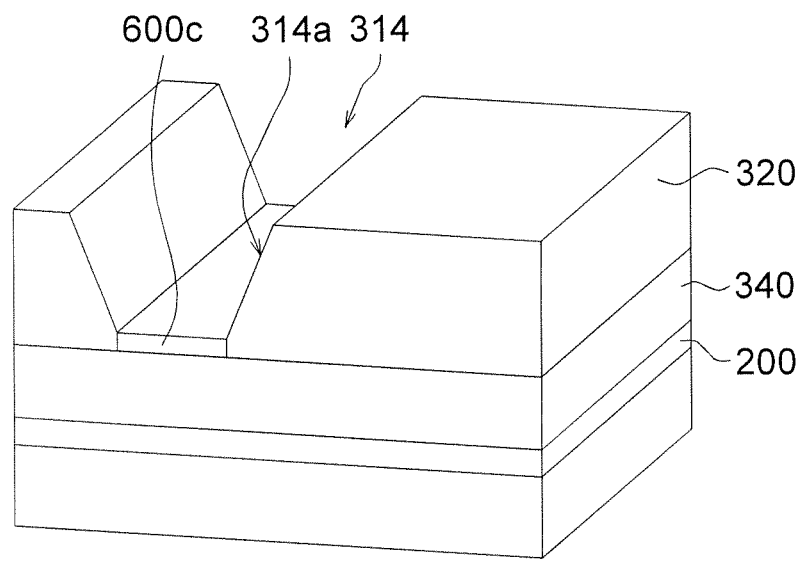
Figure 9C:
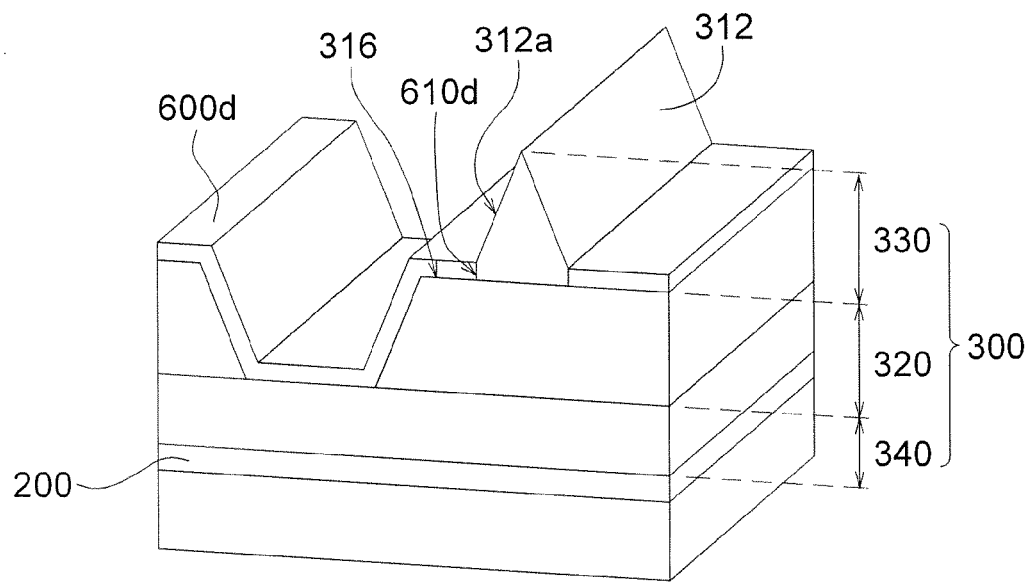

FIGS. 9A to 9C illustrate a method for growing the texture on the transition layer according to an embodiment of the present invention. Referring to FIG. 9A, one of the approaches applies a mask layer 600c with an opening 610c to the first semiconductor layer 200 first, wherein a part of the first semiconductor layer 200 is exposed by the opening 610c. Next, referring to FIG. 9B, a semiconductor material layer 320 having a trench 314 with an inclined facet 314a may be grown on the exposed part of the first semiconductor layer 200, and then the mask layer 600c may be removed. Note that this approach may need to form another semiconductor material layer 340 on the first semiconductor layer 200 before the semiconductor material layer 320 is formed thereon and may use to form the trench with an inverse truncated pyramid contour only.

After that, referring to FIG. 9C, another mask layer 600d with an opening 610d may be applied to the exposed first semiconductor layer 200 and the semiconductor material layer 320, wherein a part of the semiconductor material layer 320 is exposed by the opening 610d. Thereafter, another semiconductor material layer 330 may be grown on the exposed part of the semiconductor material layer 320 to form a protrusion 312 with another inclined facet 312a, and then the mask layer 600d may be removed, so as to form a shoulder facet 316. In a non-illustrated embodiment, the mask layer with an opening may be applied to previous semiconductor material layer for several times to form more than two semiconductor material layers respectively having a protrusion or a trench stacked to one another, so as to form a texture with a plurality of shoulder facets.

Figure 10A:
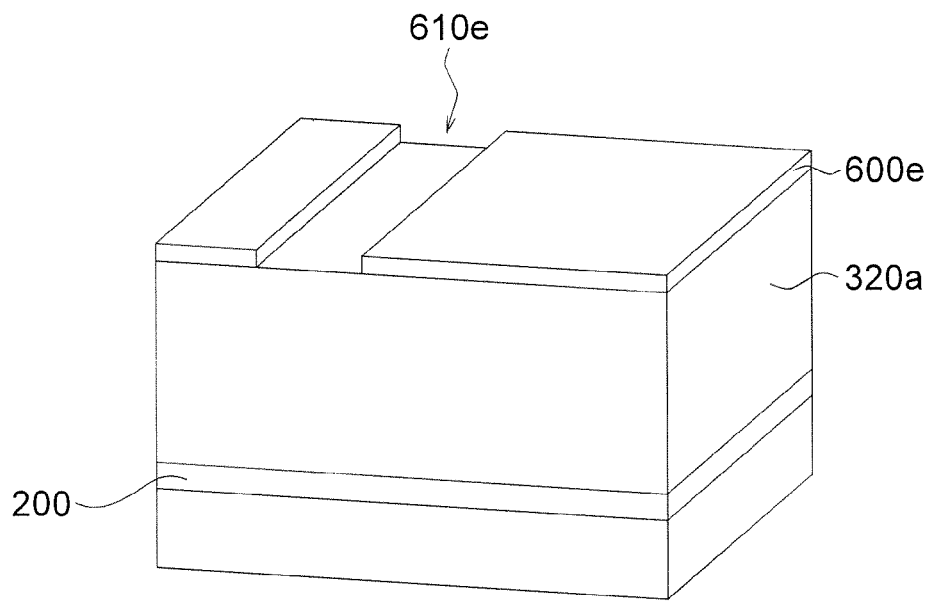
FIGS. 10A to 10C illustrate a method for growing the texture on the transition layer according to another embodiment of the present invention.
Figure 10B:
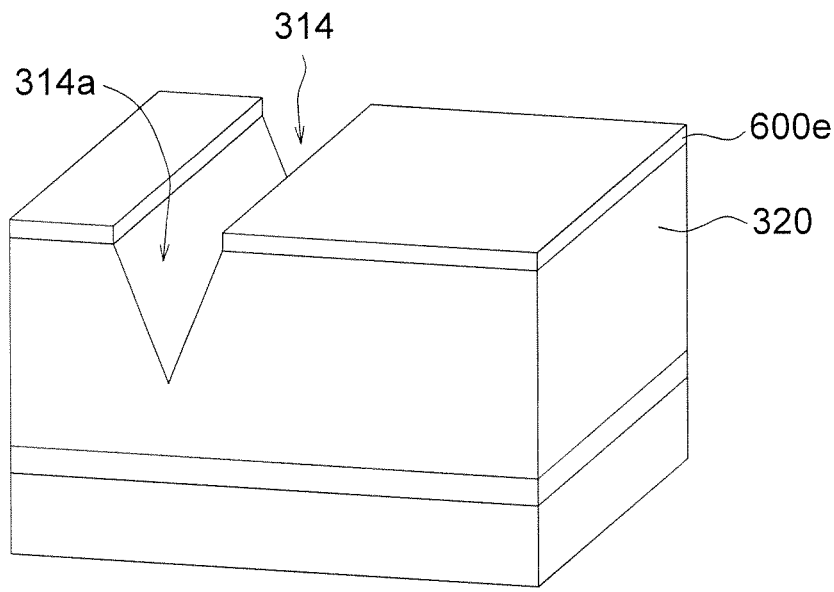
Figure 10C:
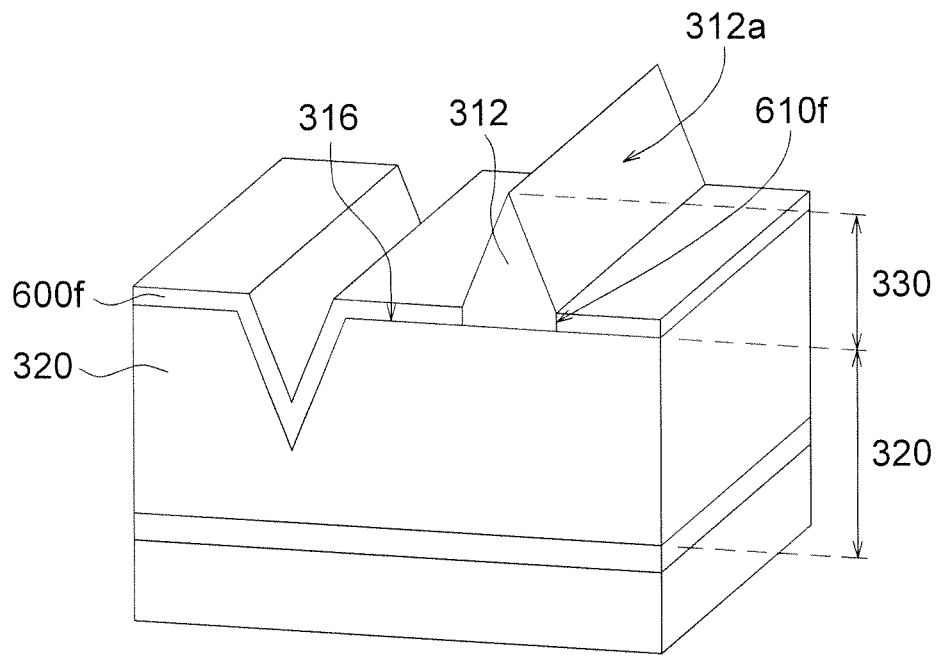

FIGS. 10A to 10C illustrate a method for growing the texture on the transition layer according to another embodiment of the present invention. Referring to FIG. 10A, another approach grows a semiconductor material layer 320a on the first semiconductor layer 200 first. Next, a mask layer 600e may be applied to cover a part of the semiconductor material layer 320a to be kept and an opening 610e thereof may expose the remaining part of the semiconductor material layer 320a to be etched. After that, the exposed part of the semiconductor material layer 320a may be anisotropic etched, so as to form a semiconductor material layer 320 having a trench 314 with another inclined facet 314a as illustrated in FIG. 10B, and then the mask layer 600e may be removed.

After that, similar to the previous embodiment as illustrated in FIG. 9C, another mask layer 600f may be applied to the semiconductor material layer 320 and an opening 610f thereof may expose a part of the semiconductor material layer 320, and then another semiconductor material layer 330 may be grown on the exposed part of the semiconductor material layer 320 to form a protrusion 312 with another inclined facet 312a. Thereafter, the mask layer 610f may be removed, so as to form a shoulder facet 316.

Figure 11A:
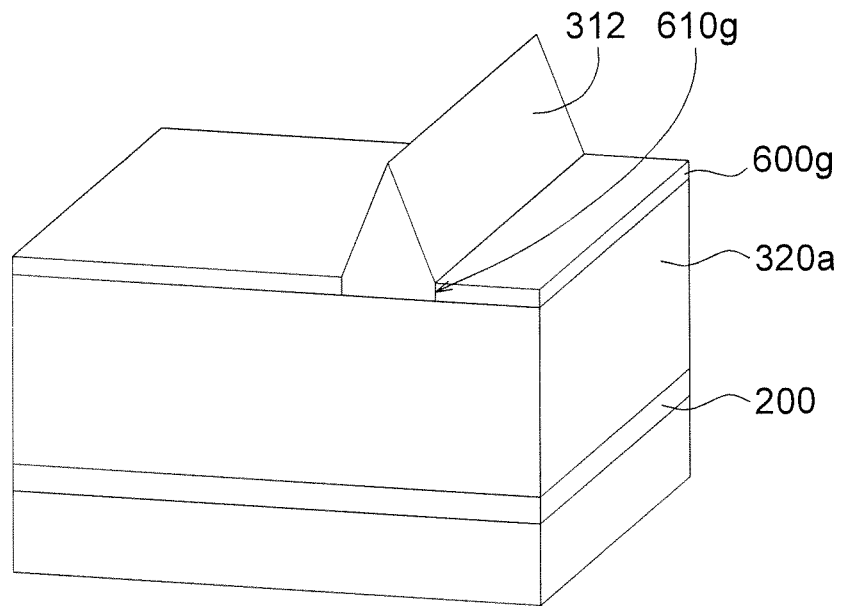
FIGS. 11A to 11C illustrate a method for growing the texture on the transition layer according to another embodiment of the present invention.
Figure 11B:
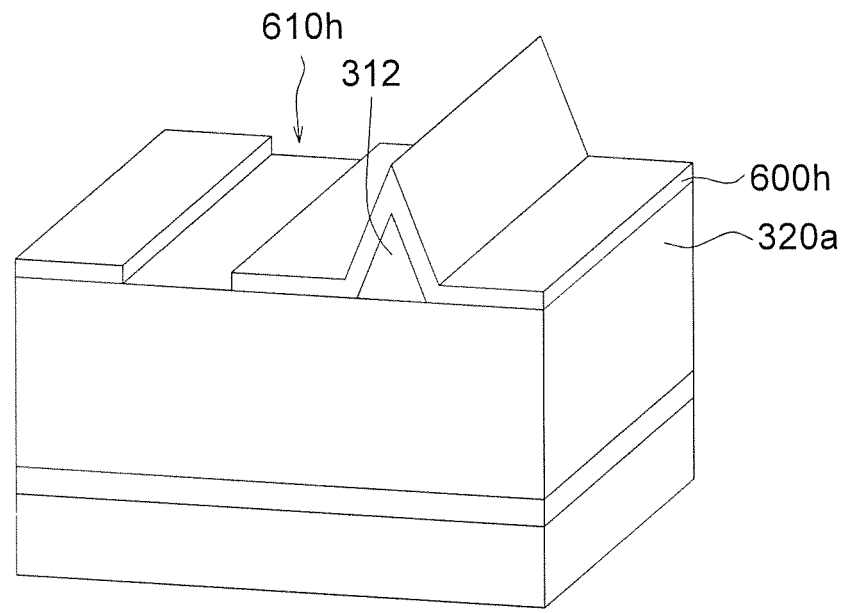
Figure 11C:
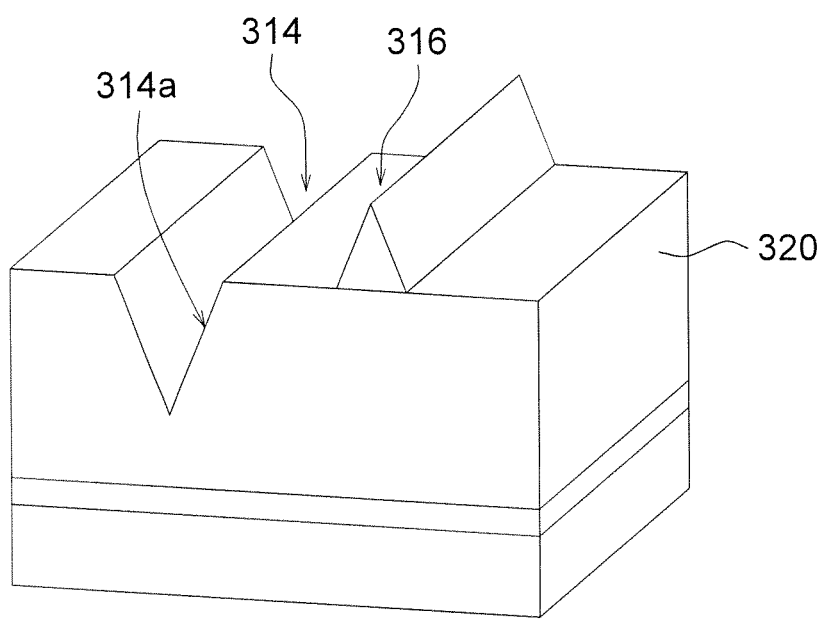

FIGS. 11A to 11C illustrate a method for growing the texture on the transition layer according to another embodiment of the present invention. Alternatively, referring to FIG. 11A, an opening 610g of a mask layer 600g may expose a part of the semiconductor material layer 320a where the protrusion 312 will be grown on first. Next, referring to FIG. 11B, another mask layer 600h with an opening 610h exposing the part of the semiconductor material layer 320a to be etched may be applied to cover the protrusion 312 and the part of the semiconductor material layer 320a to be kept after the protrusion 312 is grown and the mask layer 600g as illustrated in FIG. 11A is removed. And then, the mask layer 600h may be removed after the semiconductor material layer 320a is anisotropic etched, so as to form the shoulder facet 316 and the semiconductor material layer 320 having the trench 314 with the inclined facet 314a as illustrated in FIG. 11C.

In a word, each inclined facet of the texture may be formed by a growing process as the steps illustrated in FIGS. 9A to 9C, and a slope thereof may be adjusted by a growth speed. Thus, the inclined facets may not only be all parallel to one another, but also have some different slope as users' requiring. In addition, some inclined facets may be formed by a growing process and some inclined facets may be formed by an etching process as the steps illustrated in FIGS. 10A to 10C or FIGS. 11A to 11C. Alternatively, in a non-illustrated embodiment, each inclined facet may also be formed by an etching process.

Thereafter, referring to FIGS. 1 and 8 again, a quantum well structure 400 is grown on the inclined facets 312a, 314a and the shoulder facet 316 (S110), and then a second semiconductor layer 500 is grown on the quantum well structure 400, wherein the second semiconductor layer 500 should contain a second nitride compound semiconductor material with opposite conduction type to the first nitride compound semiconductor material (S120). Up to now, the optoelectronic component 10a is almost finished.

In summary, in contrast to the conventional epitaxy of quantum well structures on a c crystal face of a substrate, the three-dimension quantum well structure of the present invention grown on the inclined facet of the protrusion or the trench may have lower piezoelectric fields because of anisotropic relationship between strain and piezoelectric effect. In addition, since a total outer surface area of the present invention is larger than the conventional art, heat dissipation efficiency and recombination probabilities of electrons and holes of the present invention may be higher. Thus, the optoelectronic component with three-dimension quantum well structure of the present invention may have higher luminous efficiency and longer lifetime.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for producing an optoelectronic component with three-dimension quantum well structure, comprising:

A. growing a transition layer on a buffer layer disposed on a substrate;
B. applying a first mask layer to said transition layer, wherein said first mask layer has at least a first opening exposing a part of said transition layer;
C. etching said transition layer from said first opening to form a trench;
D. removing said first mask layer;
E. applying a second mask layer to said transition layer, wherein said second mask layer has at least a second opening exposing a different part of said transition layer adjacent to said trench;
F. growing a protrusion over said second opening;
G. removing said second mask layer to expose said trench and said protrusion;
H. applying a third mask layer to said transition layer and said protrusion, wherein said third mask layer has at least a third opening exposing a part of said protrusion;
I. growing another protrusion over said third opening;
J. removing said third mask layer to expose said trench and said protrusions; and
K. forming at least a pair of quantum well structures on said trench and said protrusion.

2. The method as claimed in claim 1, wherein said protrusion is away from said trench at a distance.

3. The method as claimed in claim 2, wherein a shoulder facet is connected between an inclined facet of said protrusion and an inclined facet of said trench when said first mask layer and said second layer are removed.

4. The method as claimed in claim 3, wherein a slope of said inclined facet of said protrusion is adjusted by a growth speed of said protrusion.

5. The method as claimed in claim 3, wherein said inclined facets are parallel to one another.

6. The method as claimed in claim 1, further comprising growing a semiconductor layer on said pair of quantum well structures, wherein said transition layer contains a first nitride compound semiconductor material and said second semiconductor layer contains a second nitride compound semiconductor material with opposite conduction type to said first nitride compound semiconductor material.

7. The method as claimed in claim 1, wherein the steps H, I and J are processed in sequence more than one time before the step K is processed.

* * * * *